(12) United States Patent
Capasso et al.

(10) Patent No.: US 6,301,282 B1
(45) Date of Patent: Oct. 9, 2001

(54) LONG WAVELENGTH SEMICONDUCTOR LASERS INCORPORATING WAVEGUIDES BASED ON SURFACE PLASMONS

(75) Inventors: Federico Capasso, Westfield; Alfred Yi Cho, Summit; Claire F. Gmachl, Millburn; Albert Lee Hutchinson, Piscataway; Deborah Lee Sivco, Warren, all of NJ (US); Jerome Faist, Neuchatel (CH); Carlo Sirtori, Paris (FR)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/124,295

(22) Filed: Jul. 29, 1998

(51) Int. Cl.$^7$ .......................................... H01S 5/00

(52) U.S. Cl. ................................ 372/46; 372/45

(58) Field of Search .................. 372/44–46, 50, 372/96; 385/37

(56) References Cited

U.S. PATENT DOCUMENTS

| | | | |
|---|---|---|---|
| 4,105,955 | * | 8/1978 | Hayashi et al. . |
| 4,482,779 | * | 11/1984 | Anderson . |
| 4,765,705 | * | 8/1988 | Seymour et al. . |
| 4,877,301 | * | 10/1989 | Yokomori et al. ................. 385/37 |
| 5,457,709 | | 10/1995 | Capasso et al. ................... 372/45 |
| 5,502,787 | | 3/1996 | Capasso et al. ................. 385/123 |
| 5,509,025 | | 4/1996 | Capasso et al. ................... 372/45 |
| 5,568,504 | * | 10/1996 | Kock et al. ......................... 372/96 |

FOREIGN PATENT DOCUMENTS 1-098138 * 4/1989 (JP) .

OTHER PUBLICATIONS

P. Zory, Laser oscillation . . . , Appl. Phys. Lett., vol. 22, No. 4, pp. 125–128 (1973) Feb.
A. Koch et al., Strongly directional . . . , Appl. Phys. Lett., vol. 57, No. 22, pp. 2327–2329 (1990) Nov.
A. Koch et al., Novel surface . . . , Appl. Phys. Lett., vol. 63, No. 9, pp. 1164–1166 (1993) Aug.
C. Sirtori et al., Quantum cascade . . . , Appl. Phys. Lett., vol. 66, No. 24, pp. 3242–3244 (1995) Jun.
C. Sirtori et al., Long wavelength . . . , Appl. Phys. Lett., vol. 69, No. 19, pp. 2810–2812 (1996) Nov.
C. Sirtori et al., Pulsed and Continuos–Wave . . . , IEEE J. Quantum Electr., vol. 33, No. 1, pp. 89–93 (Jan. 1997).
F. Capasso et al., Infrared (4–11 $\mu$m) . . . , Solid State Communication, vol. 102, No. 2–3, pp. 231–236 (1997) (No month).
G. Scamarcio et al., High–Power . . . , Science, vol. 276, pp. 773–776 (1997) May.
C. Gmachl et al., High–power . . . , Appl. Phys. Lett., vol. 72, No. 24, pp. 3130–3132 (1998) Jun.

* cited by examiner

Primary Examiner—Quyen P. Leung
(74) Attorney, Agent, or Firm—Michael J. Urbano

(57) ABSTRACT

A long wavelength (e.g., mid-IR to far-IR) semiconductor laser comprises an active region and at least one cladding region characterized in that the cladding region includes a light guiding interface between two materials which have dielectric constants opposite in sign. Consequently, the guided modes are transverse magnetic polarized surface waves (i.e., surface plasmons) which propagate along the interface without the need for a traditional dielectric cladding. In a preferred embodiment, the interface is formed between a semiconductor layer and a metal layer. The complex refractive index of the metal layer preferably has an imaginary component which is much larger than its real component. In an illustrative embodiment, our laser includes a QC active region sandwiched between a pair of cladding regions one of which is a guiding interface based on surface plasmons and the other of which is a dielectric (e.g., semiconductor) structure.

22 Claims, 3 Drawing Sheets

US 6,301,282 B1

LONG WAVELENGTH SEMICONDUCTOR LASERS INCORPORATING WAVEGUIDES BASED ON SURFACE PLASMONS

GOVERNMENT CONTRACT

This invention was made with Government support under Contract No. DAAH04-96-C-0026 by the DARPA/US Army Research Office. The Government has certain rights in this invention.

FIELD OF THE INVENTION

This invention relates generally to long wavelength semiconductor lasers and, more particularly, to such lasers which incorporate a waveguide based on surface plasmons.

BACKGROUND OF THE INVENTION

The divergence experienced by a light beam propagating in a homogenous medium may be dramatically reduced in a multi-layered dielectric structure with appropriate choice of the materials and thicknesses of the layers. This effect is commonly used wherever guiding or confinement of the light beam is necessary, such as in optical fibers, solid-state optical waveguides or semiconductor lasers. The latter typically utilize a dielectric slab or rib/ridge waveguide structure to guide electromagnetic modes within the optical cavity resonator and to increase the overlap of the guided mode field with the laser active region. These guided modes are described as solutions of eigenvalue equations derived from Maxwell's equations with the proper set of boundary conditions given by the waveguide structure. A typical dielectric waveguide is based on refractive index contrast between a waveguide core (which includes the laser active region) and a pair of cladding regions; that is, the core, which has a relatively high refractive index, is sandwiched between cladding regions, which have a relatively lower refractive index. The ratio of the core/cladding refractive indices, the thickness of the core, and the polarization of the electromagnetic field determine the transverse dimension (the full width at half maximum (FWHM) of the mode intensity profile in a direction normal to the layers) and confinement factor $\Gamma$ of the guided mode. $\Gamma$ is in general defined as the fraction of the area under the guided mode intensity profile that overlaps the active region.

The transverse dimension of the confined modes is proportional to the effective wavelength of the radiation in the dielectric structure. Therefore, if we neglect the wavelength dispersion of the refractive indices, the propagation characteristics of the structure are preserved if the layer thicknesses are scaled linearly with the wavelength. For semiconductor lasers with emission wavelength in the mid-infrared (IR) or even far-IR, growth of very thick core and cladding layers is then required to efficiently confine the electromagnetic modes. For example, in the case of mid-IR (e.g., center wavelengths of 8–13 $\mu$m) quantum cascade (QC) lasers in the AlInAs/GaInAs materials system, a waveguide based on primarily dielectric confinement, with an overlap factor of; say, $\Gamma \approx 0.4$, would require cladding layers about 6 to 8 $\mu$m thick due to the relative weak refractive index contrast within the GaInAs/AlInAs materials system (i.e., at $\lambda \approx 10$ $\mu$m, $n_{GaInAs}=3.43$ and $n_{AlInAs}=3.18$, for undoped material). Of course, in the far-IR regime even thicker cladding layers (e.g., >10–20 $\mu$m) would be required.

The cladding layer thickness can be reduced by introducing a highly doped layer into the outermost part of the waveguide, with a doping concentration such that the plasma frequency approaches that of the optical mode. The resulting strong decrease of the real part of the refractive index, due to the anomalous dispersion, enhances the refractive index contrast, but it also introduces losses in the highly doped layer due to free carrier absorption. See, for example, three papers by C. Sirtori et al.: *Applied Phys. Lett.*, Vol. 66, No. 24, pp. 3242–3244 (1995), *Applied Phys. Lett.*, Vol. 69, No. 19, pp. 2810–2812 (1996), and *IEEE J. Quantum Electr.*, Vol. 33, No. 1, pp. 89–93 (1997,) all of which are incorporated herein by reference. As pointed out in the first of these articles at page 3243, the highly doped layer plays a "crucial role" in suppressing the coupling between the lasing mode (propagating in a conventional dielectric waveguide) and the "high-loss plasmon mode" (that might otherwise have propagated along the metal contact interface). That is, the laser is designed to suppress, not support, the plasmon mode.

SUMMARY OF THE INVENTION

In accordance with one aspect of our invention, a long wavelength (e.g., mid-IR to far-IR) semiconductor laser comprises an active region and at least one cladding region characterized in that the cladding region includes a light guiding interface between two materials that have dielectric constants opposite in sign. Consequently, the guided modes are transverse magnetic polarized surface waves (i.e., surface plasmons) which propagate along the interface without the need for a traditional dielectric cladding. In a preferred embodiment, the interface is formed between a semiconductor layer and a metal layer. The semiconductor layer may be part of the active region or may be separate from it. The complex refractive index of the metal layer has an imaginary component that is much larger than its real component. In an illustrative embodiment, our laser includes a QC active region sandwiched between a pair of cladding regions one of which is a guiding interface based on surface plasmons and the other of which is a dielectric (e.g., semiconductor) structure.

BRIEF DESCRIPTION OF THE DRAWING

Our invention, together with its various features and advantages, can be readily understood from the following more detailed description taken in conjunction with the accompanying drawing, in which.

Figure 1:
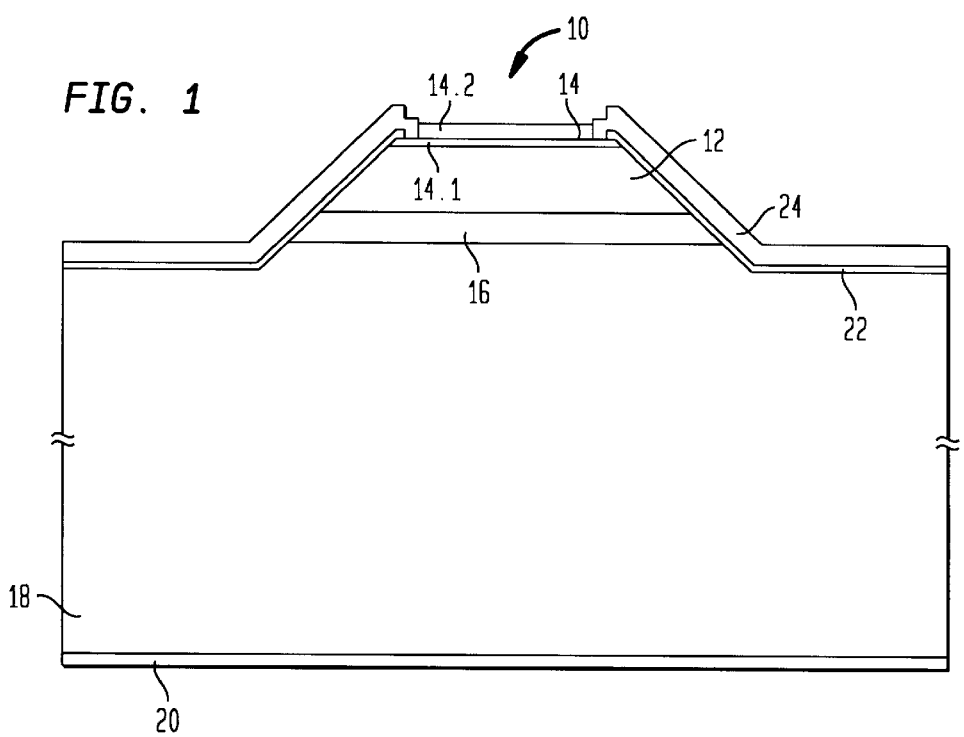
FIG. 1 is a schematic, cross-sectional view of a ridge waveguide QC laser D2295 in accordance with one embodiment of our invention. Laser D2361 is similar to D2295 but has a continuous Ti/Au top contact.

In the interest of clarity and simplicity, the FIG. 1 has not been drawn to scale. In addition, when describing physical or optical dimensions, the symbol A stands for Angstroms, whereas when describing electric current, it stands for Amperes.

DETAILED DESCRIPTION OF THE INVENTION

With reference now to FIG. 1, a long wavelength semiconductor laser 10 comprises an active region 12 and at least one guiding interface 14 that is based on surface plasmons. Interface 14 is formed by a pair of layers 14.1 and 14.2 which have dielectric constants opposite in sign. Illustratively, layer 14.1 comprises a semiconductor having a positive dielectric constant, and layer 14.2 comprises a metal having a negative dielectric constant. Layer 14.1 may be part of the active region, or it may be separate therefrom; e.g., it may be one or more layers that facilitate making electrical contact to the laser or facilitate processing the laser. When layer 14.2 is a metal, it may also serve as an electrical contact. Preferably the imaginary component of the complex refractive index of layer 14.2 is much larger than its real component.

Figure 2:
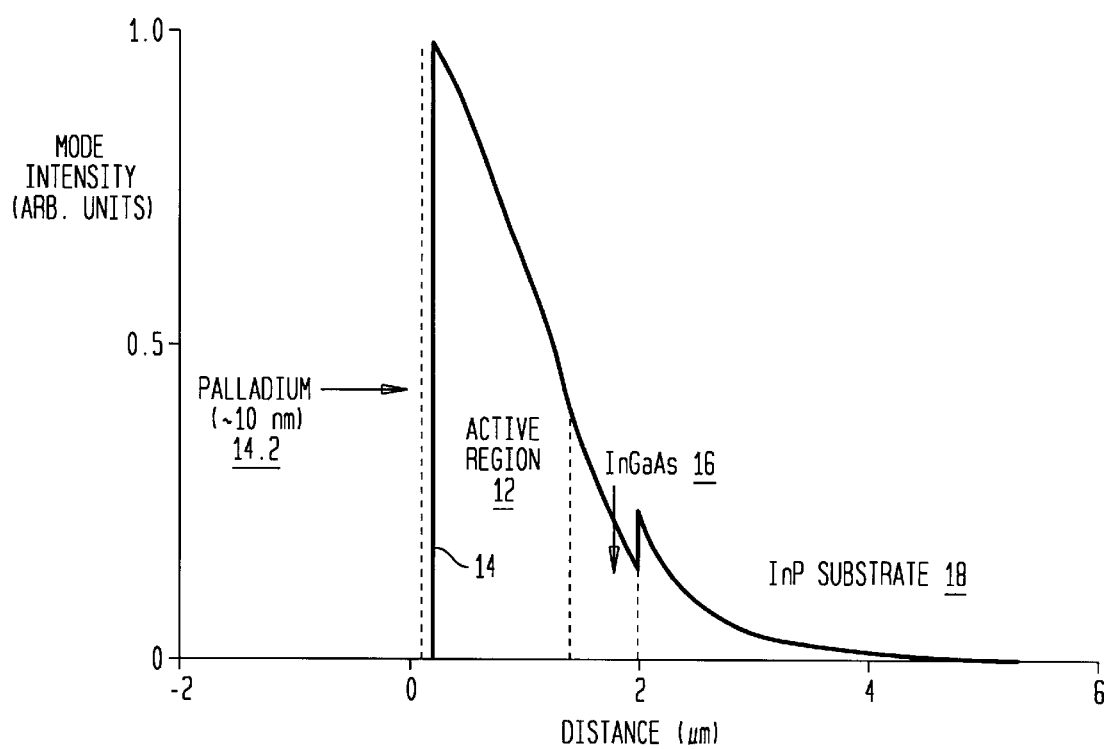
FIG. 2 is a mode intensity profile in the direction perpendicular to the layers for laser D2295. The overlap factor ($\Gamma$) for the active region was calculated as 70%. For simplicity, layer 14.2 has been omitted from this figure.

More specifically, in our approach to waveguiding in a long wavelength semiconductor laser, the guided modes in the active region are supported, at least in part, by electromagnetic surface waves (surface plasmons) at metal-semiconductor interface 14. No additional cladding layer is needed since the amplitude of the optical wave decreases exponentially in the two directions normal to that interface. However, as shown in FIG. 1, a dielectric cladding may be used on the lower side of the active region to provide additional optical confinement. In either case the guided modes are transverse-magnetic (TM) modes that propagate at the interface 14 and overlap the active region 12. Because the interface 14 provides the desired guiding along the top of the active region, the conventional multi-layered dielectric cladding above the active region is omitted. The omission of low refractive index material (as would be found in such a cladding) between the active region and the guiding interface 14 allows the peak intensity of the lasing mode to be located essentially at (or very near to) the interface 14. (See, FIG. 2 which shows the peak intensity to be at the interface 14). Thus, the lasing mode and the plasmon mode are tightly coupled; i.e., the plasmon mode is supported Consequently, the total thickness of the semiconductor layers that have to be grown (e.g., by molecular beam epitaxy (MBE)) is considerably reduced (e.g., by a factor of 2.5 in one embodiment of our invention). This feature of our invention leads to several advantages. First, reduced growth time means shorter production cycles and lower cost. Second, thinner device structures have reduced thermal resistance (i.e., a thinner device tends to have better thermal coupling to its heat sink).

However, surface waves at a metal-dielectric interface experience relatively higher optical losses, as compared to purely dielectric waveguides, since the mode partly penetrates into the metal. Fortunately, these absorption losses are less of a problem at mid-IR and far-IR wavelengths than at shorter wavelengths; i.e., the loss experienced by surface plasmons in metals is smaller in these IR ranges than at shorter wavelengths. This follows from the enhancement of the imaginary component of the complex refractive index $n_c=(n-ik)$ relative to the real component, which reduces the penetration of the mode into the metal, thus increasing the reflection coefficient at the guiding interface. In contrast, we note that the absorption coefficient of bulk metals at these longer wavelengths is, in general, higher than at shorter wavelengths, but in the case of surface plasmons this effect is more than offset by the strongly reduced penetration of the surface plasmon mode into the metal, so that the total loss for these modes is reduced.

For electromagnetic surface waves the modal losses are strongly dependent on the dielectric constants of the materials. The attenuation coefficient a can be written as:

$$\alpha = \frac{4\pi nkn_d^3}{\lambda[(n^2-k^2)(n_d^2+n^2-k^2)^3]^{0.5}} \approx \frac{4\pi nn_d^3}{\lambda k^3} \quad (1)$$

where n and k are, respectively, the real and imaginary part of the complex refractive index of the metal, $n_d$ is the refractive index of the dielectric, and $\lambda$ is the optical wavelength in a vacuum. The approximate equality holds since the dispersion of metals in the mid-IR is such that the value of k is typically much larger than that of n and $n_d$. Therefore, it follows that the losses at the interface can be minimized by choosing metals having a complex refractive index ($n_c=n+ik$) with a strong imaginary component (i.e., k>>n). Note, when k>n, the dielectric constant is negative.

An illustration will be instructive. At a wavelength of about 10 $\mu$m alkali metals have optical properties which satisfy this requirement (e.g., lithium at 9 $\mu$m has $n_c=0.659+i38$). Nevertheless, these materials are difficult to handle, are unstable, and have poor electrical conductivity. Among those metals which are commonly used for device fabrication, palladium is currently preferred for our applications. Its complex refractive index at an 11.3 $\mu$m wavelength, corresponding to the emission frequency of one of our laser structures, is $n_c=3.85+i49.2$. Inserting into equation (1) the n and k values of Pd and the value of the refractive index of the laser active region ($n_d=3.38$,) we obtain $\alpha=14$ cm$^{-1}$. On the other hand, using the complex refractive index of gold, we would obtain $\alpha \sim 30$ cm$^{-1}$. Both calculations apply to ideal bulk semiconductor-metal interfaces.

Our waveguide structures, though, are more complicated than a single bulk semiconductor-metal interface. Therefore, equation (1) provides only qualitative guidance for the choice of the metal. The significant difference is the substrate beneath the active region that has a lower refractive index than the latter. Thus, the substrate strongly reduces the penetration of the mode into the semiconductor material, enhances the overlap factor with the active region, and increases the mode-intensity at the interface. To obtain a more accurate prediction of the intensity pattern and modal losses of the TM interface modes a numerical calculation based on the well-known transfer matrix method has been used. The results are presented in FIG. 2. Note, these waveguides achieve a clear enhancement of the overlap factor ($\Gamma \cong 70\%$) over a regular slab waveguide ($\Gamma \cong 40\%$) with the same thickness of the waveguide core.

In one embodiment, the active region 12 is bounded on its upper side by the guiding interface 14 and on its lower side by a substrate 18 that serves as a dielectric cladding; i.e., a semiconductor region having a lower refractive index than the active region. On the other hand, layer 16, disposed between the active region and the substrate, typically has a refractive index greater than that of the substrate and greater than that of the active region and, as such, serves to enhance confinement of the lasing mode to the active region. In this regard, the refractive index of the active region is a weighted average of the refractive indices of its various layers.

In another embodiment, the laser 10 is a ridge waveguide laser, in which case the active region 12, the guiding interface 14 and the layer 16 are formed in an elongated mesa. The mesa in turn is formed on a substrate 18. In this embodiment, layer 14.1 illustratively comprises a contact-facilitating layer which also serves to protect the active region during processing (e.g., to protect an Al-containing active region from oxidation).

Of course, the active region is disposed in an optical cavity resonator which may be formed by any of several techniques well known in the art; e.g., by a pair of parallel cleaved facets, a distributed feedback grating, a distributed Bragg reflector, or a combination of them. When suitable pumping energy is applied to the active region, it generates lasing radiation in the form of stimulated emission which propagates within the resonator in a direction perpendicular to the plane of FIG. 1. As depicted in FIG. 1, the laser 10 is pumped electrically by means of contact 20 formed on the bottom of substrate 18 and by metal layer 24 that contacts the top of the mesa. In the field of the device and on the sidewalls of the mesa, an insulating layer 22 separates metal layer 24 from the underlying semiconductor. Layers 22 and 24 are patterned to form an opening in which layer 14.2 is deposited. Depending on the characteristics of the metal and the electrical nature of the interface 14, layer 14.2 may also serve as an electrical contact. In addition, although metal layers 14.2 and 24 are depicted as being separate layers (e.g., of different materials), they may be a single, continuous layer of the same material, as long as layer 14.2 has the above-described characteristics for providing waveguiding based on surface plasmons.

From an optical perspective, a DFB grading could be formed in layer 14.2, thereby taking advantage of the strong coupling between the active region and the mode guided by the interface 14.

In a preferred embodiment for operation at mid-IR wavelengths (e.g., about 3–13 $\mu$m) or far-IR wavelengths (e.g., approximately 20–100 $\mu$m), the active region 12 comprises a QC active region. The term QC active region includes a multiplicity of essentially identical radiative transition (RT) regions and a multiplicity of injection/relaxation (I/R) regions interleaved with the RT regions. The RT regions, which include quantum well regions interleaved with barrier regions, as well as the I/R regions each comprise a multiplicity of semiconductor layers. At least some of the layers of each I/R region are doped, but in any case the I/R regions as well as the RT regions are unipolar. In addition, the term QC active region is intended to embrace both diagonal lasing transitions as well as vertical lasing transitions. Diagonal transitions involve radiative transitions between upper and lower laser energy levels or states where the wave functions (the moduli squared) corresponding to the levels are substantially localized in different quantum wells of the same RT region. See, U.S. Pat. No. 5,457,709, which is incorporated herein by reference. On the other hand, in the case of vertical transitions the excited and lower energy states are both substantially in the same quantum well of a single RT region. See, U.S. Pat. No. 5,509,025, which is also incorporated herein by reference. Both types of lasing transitions are also described in an article by F. Capasso et al., *Solid State Communications,* Vol. 102, No. 2–3, pp. 231–236 (1997), which is also incorporated herein by reference. This article, as well as the '025 patent, point out that the I/R regions of a vertical transition QC laser may include minibands and a minigap between the minibands to form an effective Bragg reflector for electrons in the excited state and to ensure swift electron escape from the lower states.

Yet another intersubband laser, known as a superlattice laser, can also benefit from implementation in accordance with our invention. In a superlattice laser the wavefunctions of the laser levels are spread over a multiplicity of quantum wells within each RT region. Laser action is achieved through unipolar injection by inter miniband transport or tunneling. See, G. Scamarcio et al., *Science,* Vol. 276, pp. 773–776 (1997), which is incorporated herein by reference.

EXAMPLES

In the following examples, referred to as samples D2295 and D2361, various materials, dopants, concentrations, dimensions, operating conditions, process steps and other parameters are provided by way of illustration only and, unless expressly stated otherwise, are not intended to limit the scope of our invention. In addition, as used herein, the term undoped means that a particular semiconductor layer or region is not intentionally doped; i.e., any doping of such a region or layer is relatively low and typically results from residual or background doping in the chamber used to grow the layers of the device.

Two QC laser structures were grown by MBE: samples D2295 and D2361 use a QC-laser active region (I/R plus RT regions) emitting at center wavelengths of $\lambda\approx 11$ $\mu$m and $\lambda\approx 8$ $\mu$m, respectively. The layered structure is shown in Tables I and II below. Details of the multi-layered InAlAs/InGaAs active regions are described by C. Sirtori et al. in *Applied Phys. Lett.,* Vol. 69, No. 19, pp. 2810–2812 (1996) and by C. Gmachl et al. in *Applied Phys. Lett.,* Vol. 72, No. 24, pp. 3230–3232 (Jun. 15, 1998), which are both incorporated herein by reference.

TABLE I

| D2295 Composition | Doping (n-type; cm$^{-3}$) | Thickness (nm) |
|---|---|---|
| InGaAs | 1 × 10$^{20}$ | 10 |
| InGaAs | 4 × 10$^{17}$ | 50 |
| I/R Region; (Digital grading; 25x) | 4 × 10$^{17}$ | 31 (25x) |
| RT Region; (Undoped; 25x) | — | 24 (25x) |
| Digital grading | 2 × 10$^{17}$ | 17 |
| InGaAs (Buffer) | 6 × 10$^{16}$ | 700 |
| Digital grading | 1.5 × 10$^{17}$ | 25 |
| InP (Substrate) | 2 × 10$^{17}$ | — |

TABLE II

| D2361 Composition | Doping (n-type; cm$^3$) | Thickness (nm) |
|---|---|---|
| InGaAs | 1 × 10$^{20}$ | 10 |
| InGaAs | 1 × 10$^{17}$ | 50 |
| I/R Region (Digital grading; 35x) | 1 × 10$^{17}$ | 22 (35x) |
| RT Region (Undoped; 35x) | — | 22 (35x) |
| Digital grading | 1 × 10$^{17}$ | 15 |
| InGaAs (Buffer) | 5 × 10$^{16}$ | 500 |
| InP (Substrate) | 1–4 × 10$^{17}$ | — |

The laser structure shown in FIG. 1 corresponds to that of sample D2295 (Table I) and comprised a 700 nm thick InGaAs buffer layer (Si doped to about 6×10$^{16}$ cm$^{-3}$) sandwiched between an optional first digitally graded layer (about 25 nm thick), grown on a low-doped ($\approx$2×10$^{17}$ cm$^{-3}$) InP substrate, and a second digitally graded layer (about 17 nm thick), grown on the buffer layer. Then, 25 periods of a RT region (each period being about 24 nm thick; $\lambda\approx$11.4 $\mu$m) and 25 periods of an I/R region (each period being a third digitally graded layer about 31 nm thick) were grown on the second digitally graded layer. The digitally graded layers, each of which comprised alternating layers of InAlAs and InGaAs, are well known in the art, as described for example by F. Capasso et al. in U.S. Pat. No. 5,509,025 issued on Apr. 16, 1996 and incorporated herein by reference.

The growth sequence was completed with a pair of InGaAs layers: first a 50 nm thick layer doped with Si to about $4 \times 10^{17}$ cm$^3$ and lastly a≈10 nm thick layer highly doped with Sn to about $1 \times 10^{20}$ cm$^{-3}$. Together the last two layers are shown as layer 14.1 in FIG. 1.

The active region structure of sample D2361 (Table II) was similar to that of D2295 but contained 35 periods of the corresponding RT and I/R regions, was designed to lase at a center wavelength of λ≈8 μm, and omitted the first digitally graded layer. Although the latter is optional in these QC lasers, it may be advantageous in reducing the internal voltage drop across the devices.

The lasers were fabricated as ≈10–20 μm wide, deep-etched, ridge waveguide devices. Si$_3$N$_4$ was used for electrical insulating layer 22 on the side-walls of the mesas and in the field of the device. For sample D2295, metal layer 14.2 comprised about 100–300 Å of Pd, and metal layer 24 comprised about 30 nm of Ti on about 300 nm of Au. Other thicknesses of all of these metals may also be suitable. Both metal layers were e-beam evaporated. Layer 14.2 was deposited directly onto the surface of the highly doped InGaAs layer and into a≈10 μm wide elongated window on top of the mesa that had been left open during deposition of the electrical top contact (Ti/Au metal layer 24). This procedure was utilized because the Pd layer by itself did not prove to be a suitable electrical contact. In contrast, in laser D2361, Pd was not used; i.e., Ti/Au was used for both layer 14.2 and layer 24. Thus, the Ti/Au layer simultaneously acted as an electrical contact and formed the guiding interface 14 for the surface plasmon modes. In this case, the Au layer contacted layer 14.1 (i.e., the highly doped InGaAs layer). Non-alloyed Ge/Au/Ag/Au was applied to the InP substrate as back-contact 20.

The lasers were cleaved into bars approximately 0.75 to 3 mm long, wire-bonded, soldered to a copper heat sink and mounted inside a helium flow cryostat. Measurements were performed with current pulses (about 50 ns pulse width with about 5 kHz repetition rate) applied across contacts 24 and 20. Calibrated HgCdTe-detectors were used to detect the light output from the lasers. Spectral measurements were performed using a Fourier Transform Infrared (FTIR) spectrometer.

Figure 3:
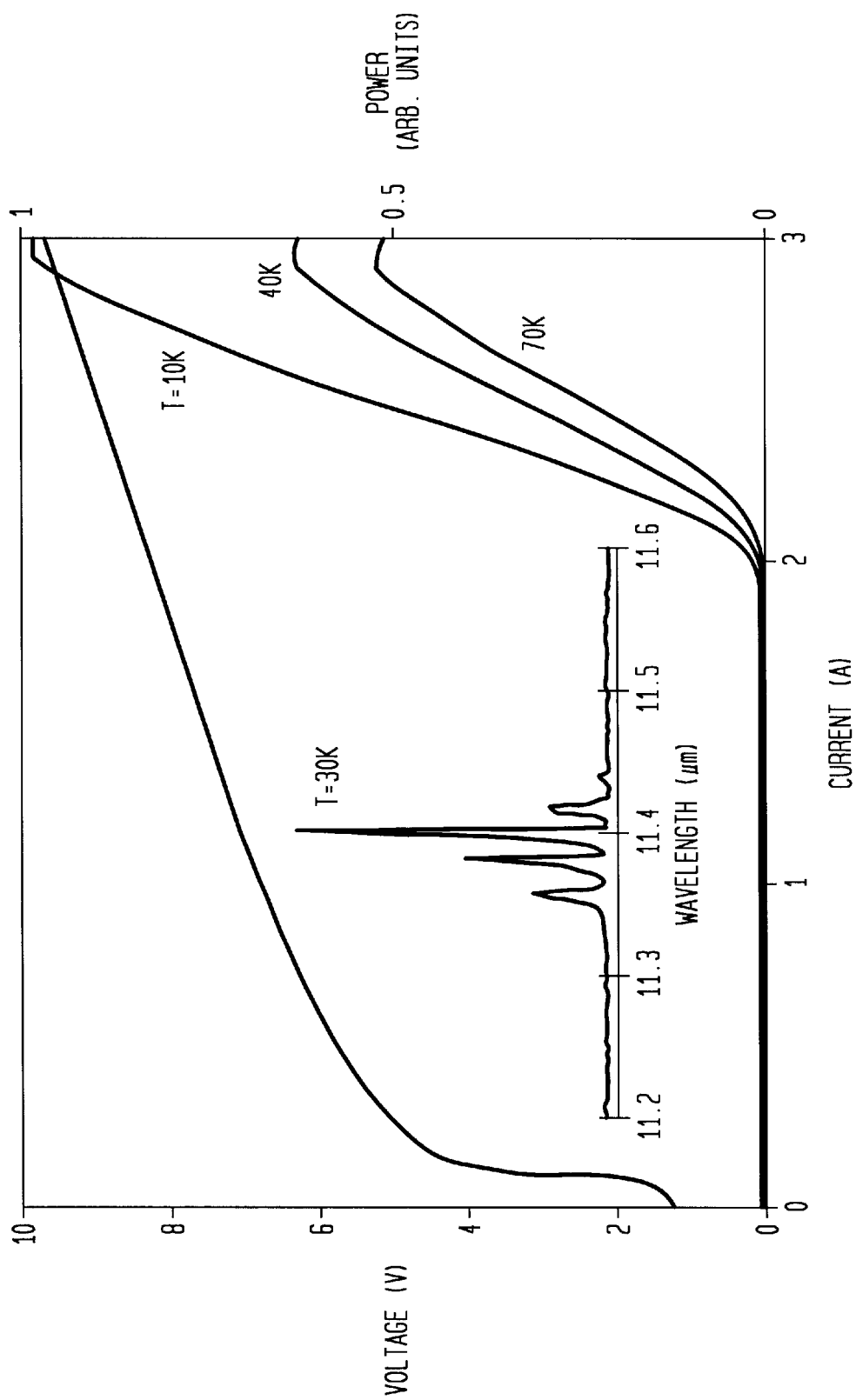
FIG. 3 shows the applied bias and measured peak output power at three different heat sink temperatures from a single laser facet as a function of injected current. The laser was 20 $\mu$m wide and 0.8 mm long. The inset is a high resolution laser spectrum of the laser at 30 K. The maximum peak output power was estimated to be several milliwatts.

FIG. 3 shows the light-output and voltage versus current characteristics of a mid-IR (λ=11.4 μm) laser from sample D2295. The threshold current density was $J_{th} \cong 11$ kA/cm$^2$ at 10 K, and laser action was observed up to ~110 K. From the measured mode separation Δv (derived from the spectrum shown in the inset to FIG. 3) and the cavity length L one can approximate the modal refractive index using the formula $n_{mod} = 1/(2\Delta vL)$. From the latter we obtain an experimental value of $n_{mod}$=3.93, whereas $n_{mod}$=3.31 was calculated from the waveguide simulation. We believe that this discrepancy arises from an incomplete knowledge of both the refractive index of the metal at these wavelengths and the metal-dielectric interface morphology. The latter has a strong dependence on the diffusion of arsenic into the metal and on the native oxide which forms on the top of the semiconductor. Moreover, due to the strong dispersion of the metal refractive indices, group dispersion cannot be neglected. Therefore, the simple formula for the mode separation is not fully applicable.

Figure 4:
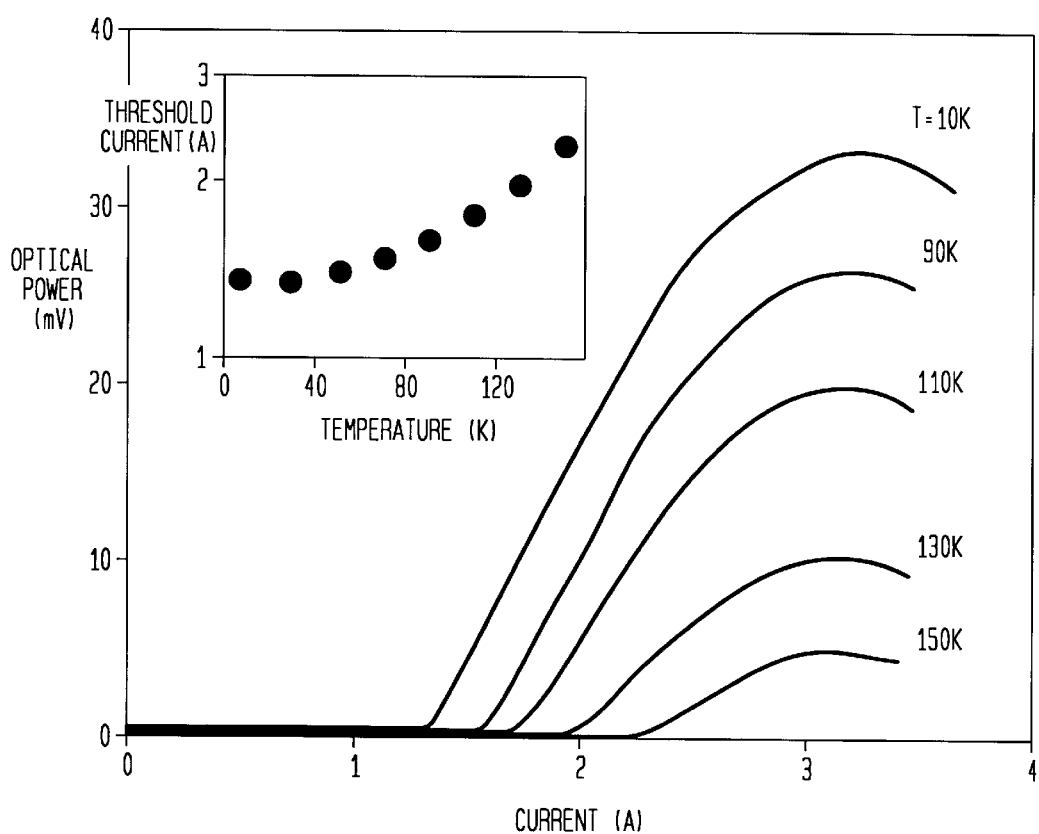
FIG. 4 shows measured peak optical power (from a single laser facet) versus drive current at different heat sink temperatures for a laser processed from sample D2361. The laser was 15 $\mu$m wide and 2.25 mm long. The inset shows the threshold current density in pulsed operation as a function of the heat sink temperature.

In FIG. 4 the light-output versus current characteristics of a representative mid-IR (λ=8.0 μm) laser from sample D2361 are shown. The threshold current density at 4 K is about 4 kA cm$^{-2}$. The highest operating temperature was about 150 K with an output power exceeding approximately 5 mW.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. Although our current experiments were directed toward mid-IR QC lasers, we expect enhanced performance at far-IR wavelengths; e.g., at 20–100 μm where the penetration of the optical field into the metal is significantly reduced. Thus, the optical losses at the metal-semiconductor interface 14 should also be reduced.

What is claimed is:

1. A semiconductor laser comprising
    an active region for generating stimulated emission of radiation at a center wavelength in the mid-IR to far-IR range in response to the application of pumping energy thereto, and
    at least one cladding region for confining said radiation to said active region, characterized in that
    said at least one cladding region comprises first and second layers forming a radiation-guiding interface therebetween, said interface interacting with said radiation so as to support surface plasmons and being free of spatially periodic structures that couple light out of said laser.

2. The invention of claim 1 wherein, at said center wavelength, said first layer has a negative dielectric constant and said second layer comprises a positive dielectric constant, said second layer being disposed between said active region and said first layer.

3. The invention of claim 2 wherein the imaginary component of the complex refractive index of said first layer is much greater than the real component of said index.

4. The invention of claim 3 wherein said first layer comprises a metal and said second layer comprises a semiconductor.

5. The invention of claim 4 wherein said first layer also forms an electrical contact to said laser.

6. The invention of claim 4 wherein said second layer is part of said active region.

7. The invention of claim 4 wherein said second layer is separate from said active region.

8. The invention of claim 7 wherein said second layer comprise a contact-facilitating layer.

9. The invention of claim 4 wherein said first layer comprises palladium.

10. The invention of claim 4 wherein said first layer comprises a composite including a layer of titanium and a layer of gold.

11. The invention of claim 1 wherein said laser is designed to operate at a wavelength above about 20 μm.

12. The invention of claim 11 wherein said active region comprises a QC active region.

13. The invention of claim 12 wherein said active region comprises a multi-layered InAlAs/InGaAs structure.

14. The invention of claim 1 wherein said laser comprises a pair of cladding regions disposed on opposite sides of said active region, one of said cladding regions comprising a dielectric structure having a refractive index less than that of said active region and the other comprising said guiding surface plasmon interface.

15. The invention of claim 1 wherein said at least one cladding region is designed so that the peak intensity of the lasing mode of said radiation is located essentially at said interface.

16. A QC laser comprising a QC active region for generating stimulated emission of radiation at a center wavelength in the mid-IR to far-IR range when pumping energy is applied thereto, and first and second cladding regions disposed on opposite sides of said active region, said first cladding region comprising a dielectric structure having a refractive index lower than that of active region, and said second cladding region comprising first and second layers forming a radiation-guiding interface therebetween, and wherein, at said center wavelength, said fist layer has a negative dielectric constant and said second layer has a positive dielectric constant, and the imaginary component of the complex refractive index of said first layer is much greater than the real component of said index, said interface interacting with said radiation so as to support surface plasmons and being free to spatially periodic structures that couple light out of said laser.

17. The invention of claim 16 wherein said first layer comprises a metal layer and said second layer comprises a semiconductor layer.

18. The invention of claim 17 wherein said first layer also forms an electrical contact to said laser.

19. The invention of claim 18 wherein said second layer is part of said active region.

20. The invention of claim 18 wherein said second layer is separate from said active region.

21. The invention of claim 20 wherein said second layer comprise a contact-facilitating layer.

22. The invention of claim 16 wherein said second cladding region is designed so that the peak intensity of the lasing mode of said radiation is located essentially at said interface.

* * * * *